United States Patent
Choi (10) Patent No.: US 9,780,327 B2
(45) Date of Patent: Oct. 3, 2017

(54) ORGANIC LIGHT EMITTING DISPLAY DEVICE

(71) Applicant: Samsung Display Co., Ltd., Yongin-si (KR)

(72) Inventor: Ilshin Choi, Yongin-si (KR)

(73) Assignee: Samsung Display Co., Ltd., Yongin-shi (KR)

( * ) Notice: Subject to any disclaimer, the term of this patent is extended or adjusted under 35 U.S.C. 154(b) by 0 days.

(21) Appl. No.: 14/880,778

(22) Filed: Oct. 12, 2015

(65) Prior Publication Data

US 2016/0111679 A1    Apr. 21, 2016

(30) Foreign Application Priority Data

Oct. 16, 2014  (KR) .................... 10-2014-0140172

(51) Int. Cl.
*H01L 51/52* (2006.01)
*H01L 27/32* (2006.01)

(52) U.S. Cl.
CPC ................... *H01L 51/5246* (2013.01)

(58) Field of Classification Search
None
See application file for complete search history.

(56) References Cited

U.S. PATENT DOCUMENTS

| | | | |
|---|---|---|---|
| 8,617,932 B2* | 12/2013 | Lee | H01L 27/3276 349/190 |
| 8,748,756 B2* | 6/2014 | Kasahara | H01L 51/5246 174/524 |
| 2001/0051398 A1* | 12/2001 | Hirakata | G02F 1/13454 438/149 |
| 2007/0177069 A1* | 8/2007 | Lee | H01L 51/5246 349/56 |
| 2007/0279571 A1 | 12/2007 | Koo et al. | |

(Continued)

FOREIGN PATENT DOCUMENTS

| | | |
|---|---|---|
| KR | 10-2006-0036522 | 5/2006 |
| KR | 10-0688972 | 3/2007 |

(Continued)

OTHER PUBLICATIONS

Guo, Chuan Fei, Jianming Zhang, Junjie Miao, Yongtao Fan, and Qian Liu. "MTMO Grayscale Photomask." Optics Express 18.3 (2010): 2621.*

*Primary Examiner* — Joseph Schoenholtz
(74) *Attorney, Agent, or Firm* — H.C. Park & Associates, PLC (57) ABSTRACT

An organic light emitting display device including a first substrate; a second substrate facing the first substrate; a display unit, which is formed on a surface of the first substrate facing the second substrate and includes at least one organic light-emitting element; a first sealing unit, which is disposed between the first substrate and the second substrate to surround the display unit; a second sealing unit, which is disposed between the first substrate and the second substrate along the inner edges of the first sealing unit and includes a plurality of dots disposed apart from one another; and a screen, which is formed on a surface of the second substrate opposite a surface facing the first substrate to cover the second sealing unit.

16 Claims, 6 Drawing Sheets

(56) References Cited

U.S. PATENT DOCUMENTS

| | | | |
|---|---|---|---|
| 2008/0213482 A1* | 9/2008 | Logunov | C03C 17/09 427/259 |
| 2010/0117067 A1 | 5/2010 | Sin et al. | |
| 2010/0148192 A1* | 6/2010 | Jung | H01L 27/3246 257/88 |
| 2011/0008593 A1* | 1/2011 | Abbott, Jr. | C03C 8/24 428/203 |
| 2011/0037095 A1* | 2/2011 | Park | H01L 51/525 257/100 |
| 2011/0291119 A1 | 12/2011 | Ryu et al. | |
| 2012/0138979 A1* | 6/2012 | Lee | H01L 51/5246 257/91 |
| 2012/0248950 A1* | 10/2012 | Niibori | H01L 51/5246 312/223.1 |
| 2012/0319092 A1* | 12/2012 | Shimomura | B32B 37/06 257/40 |
| 2013/0313528 A1* | 11/2013 | So | H01L 51/5246 257/40 |
| 2014/0097746 A1 | 4/2014 | Ha | |
| 2014/0319998 A1 | 10/2014 | Han | |
| 2015/0041772 A1 | 2/2015 | Han | |
| 2016/0035996 A1* | 2/2016 | Sun | H01L 21/77 257/40 |

FOREIGN PATENT DOCUMENTS

| | | |
|---|---|---|
| KR | 10-2010-0052895 | 5/2010 |
| KR | 10-2011-0048130 | 5/2011 |
| KR | 10-2011-0130926 | 12/2011 |
| KR | 10-2014-0044111 | 4/2014 |
| KR | 10-2014-0128595 | 11/2014 |
| KR | 10-2015-0017988 | 2/2015 |

\* cited by examiner

ORGANIC LIGHT EMITTING DISPLAY DEVICE

CROSS-REFERENCE TO RELATED APPLICATION

This application claims priority from and the benefit of Korean Patent Application No. 10-2014-0140172, filed on Oct. 16, 2014, which is hereby incorporated by reference for all purposes as if fully set forth herein.

BACKGROUND

Field

Exemplary embodiments relate to an organic light emitting display device.

Discussion of the Background

An organic light emitting display device is a self-luminescent display device, from which a light is emitted by applying a voltage to an organic layer including an anode, a cathode, and an organic emission layer disposed therebetween to recombine electrons and holes in the organic emission layer. An organic light emitting display device may not only have a smaller volume than a cathode ray tube ("CRT") or a liquid crystal display ("LCD"), but may also feature wide viewing angle, fast response, and low power consumption, thus being spotlighted as a next-generation display device.

In an organic light emitting display device, an organic light-emitting element is disposed at a display area. The organic light-emitting element includes a pixel electrode and a counter electrode, which face each other, and an emission layer interposed between the pixel electrode and the counter electrode. Because such an organic light-emitting element may be easily damaged by various substances, such as moisture or oxygen from the outside, an organic light-emitting element may be sealed to prevent permeation of external impurities. One of the popular methods therefor is sealing edges of a substrate by using a frit material.

However, a sealing portion formed of a frit is vulnerable to external shock, and thus, improved mechanical strength is desirable.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting display device with a sealing portion having improved mechanical strength and an improved outward appearance.

Additional aspects will be set forth in part in the description which follows, and, in part, will be apparent from the disclosure, or may be learned by practice of the inventive concept.

According to exemplary embodiments, an organic light emitting display device includes a first substrate; a second substrate disposed to face the first substrate; a display unit, which is disposed on a surface of the first substrate facing the second substrate and includes at least one organic light-emitting element; a first sealing unit, which is disposed between the first substrate and the second substrate and configured to surround the display unit; a second sealing unit, which is disposed between the first substrate and the second substrate along the inner edges of the first sealing unit and includes a plurality of dots disposed apart from one another; and a screen, which is formed on a surface of the second substrate opposite a surface facing the first substrate to cover the second sealing unit.

According to exemplary embodiments, an organic light emitting display device includes a first substrate; a second substrate disposed to face the first substrate; a display unit, which is formed on a surface of the first substrate facing the second substrate and includes at least one organic light-emitting element; a first sealing unit, which is disposed between the first substrate and the second substrate to surround the display unit; a second sealing unit, which is disposed between the first substrate and the second substrate along the inner edges of the first sealing unit; and a screen, which is formed on a surface of the second substrate opposite a surface facing the first substrate to cover the second sealing unit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
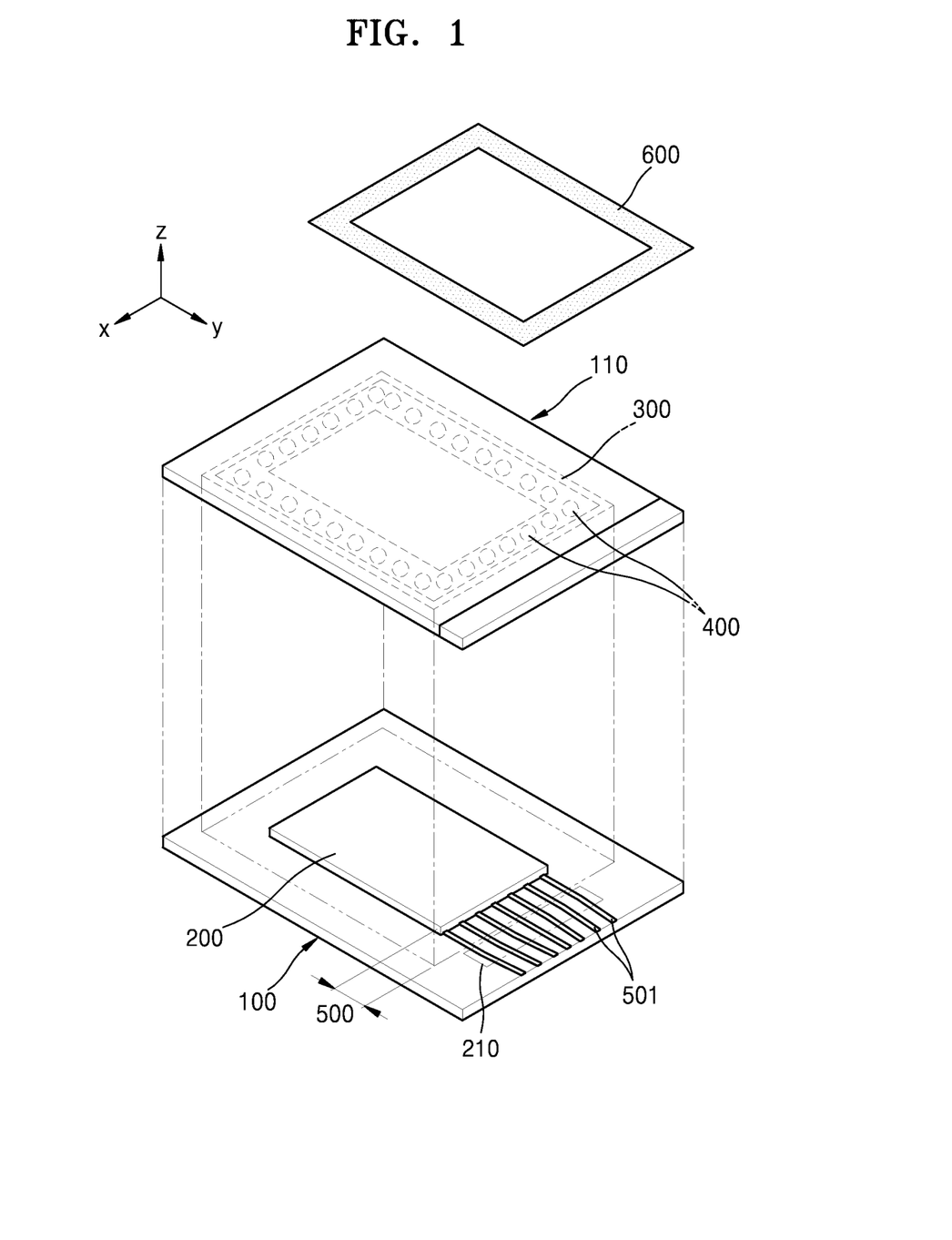
FIG. 1 is a schematic perspective diagram showing attachment between a first substrate, a second substrate, and a screen of an organic light emitting display device according to an embodiment.
Figure 2A:
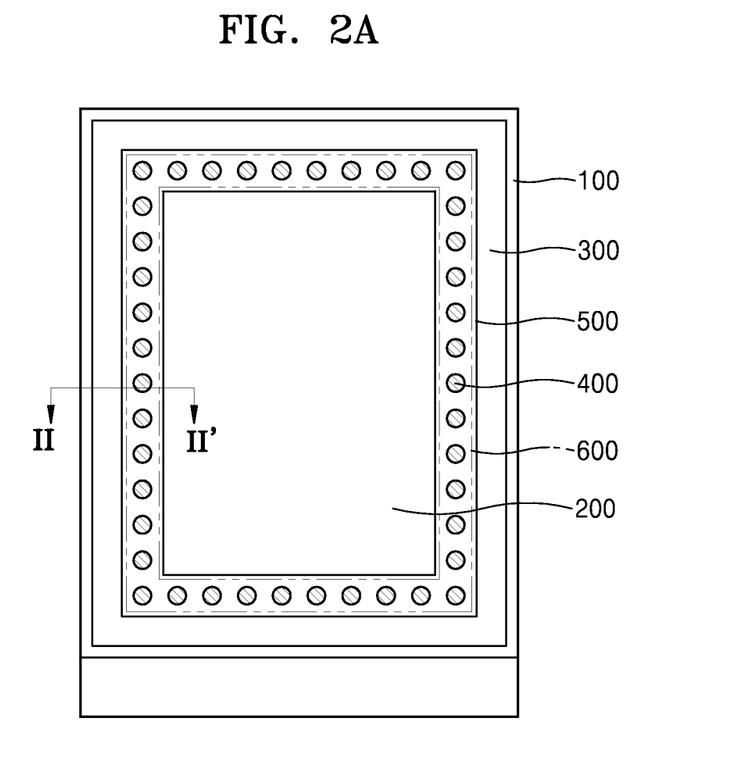
FIG. 2A is a schematic plan view of the organic light emitting display device of FIG. 1.
Figure 2B:
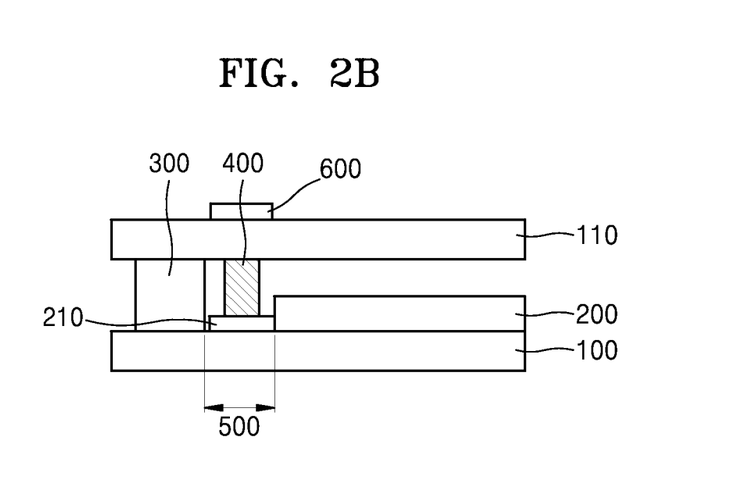
FIG. 2B is a sectional view of the same, taken along a line II-II'.

First, referring to FIGS. 1, 2A, and 2B, the organic light emitting display device according to an exemplary embodiment may include a first substrate 100, a second substrate 110 facing the first substrate 100, a display unit 200 that is formed on the first substrate 100 and includes at least one organic light-emitting element, a first sealing unit 300 that is disposed between the first substrate 100 and the second substrate 110 to surround the display unit 200, a second sealing unit 400 that includes a plurality of dots disposed apart from one another along inner edges of the first sealing unit 300, and a screen 600 that is formed on the second substrate 110 to cover the second sealing unit 400.

Furthermore, the organic light emitting display device according to an exemplary embodiment may further include a non-display unit 210 that is formed on the first substrate 100 along the outer edges of the display unit 200.

The first substrate 100 may be formed of a $SiO_2$-based transparent glass material. However, materials for forming the first substrate 100 are not limited thereto, and the first substrate 100 may also be formed of a transparent plastic material. A plastic material for forming the first substrate 100 may be an organic insulation material selected from a group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide(polyimide), polycarbonate (PC), cellulose triacetate (TAC), and cellulose acetate propionate (CAP).

Meanwhile, if the organic light emitting display device is a bottom emission type display device in which an image is formed toward the first substrate 100, the first substrate 100 is formed using a transparent material. However, if the organic light emitting display device is a top emission type display device in which an image is formed toward the second substrate 110, the first substrate 100 need not be using a transparent material.

Like the first substrate 100 as described above, the second substrate 110 may be formed of any of various materials and may be formed of at least one from among the above-stated various materials for forming the first substrate 100.

Selectively, if the second substrate 110 functions as an encapsulating substrate sealed by a frit, the second substrate 110 may be formed of a glass that almost perfectly blocks moisture or oxygen in the air.

If the organic light emitting display device is a top emission type in which an image is formed toward the second substrate 110, the second substrate 110 is formed using a transparent material. However, it is not necessary to form the first substrate 100 using a transparent material. On the contrary, if the organic light emitting display device is a bottom emission type in which an image is formed toward the first substrate 100, the first substrate 100 is formed using a transparent material, but it is not necessary to form the second substrate 110 using a transparent material. In other words, if either the first substrate 100 or the second substrate 110 is not formed of a transparent material, the first substrate 100 or the second substrate 110 may be formed of an opaque material.

The display unit 200 is disposed on the top surface of the first substrate 100. The term display unit 200 herein refers to an organic light-emitting element and a thin-film transistor (TFT) array for driving the same, that is, a portion for displaying an image and a driving unit for displaying the image.

Figure 3:
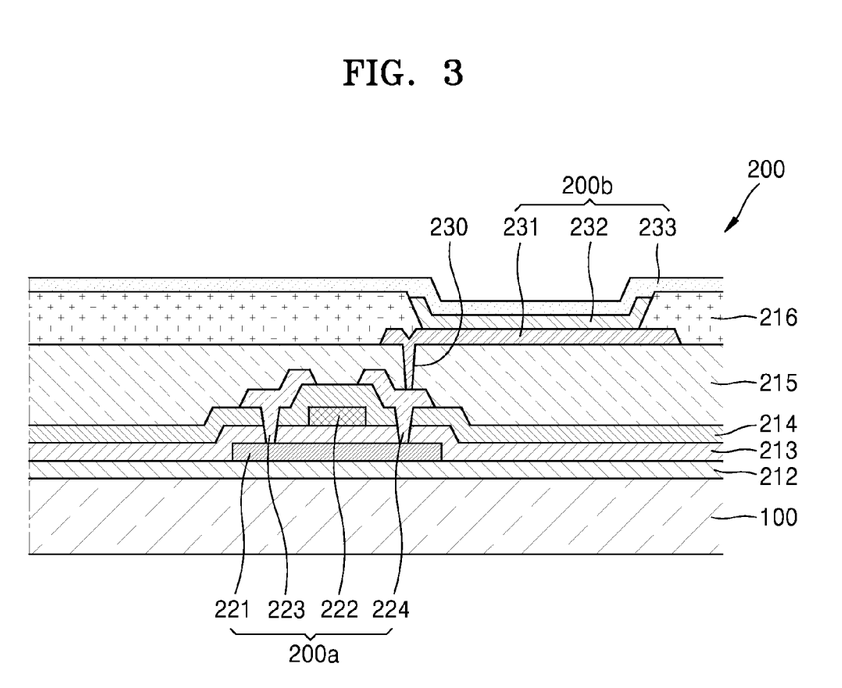
FIG. 3 is a schematic sectional view of a display unit of the organic light emitting display device of FIG. 1.

FIG. 3 is a schematic sectional view of the display unit 200 of the organic light emitting display device of FIG. 1.

The display unit 200 is formed on the first substrate 100 and may include a TFT 200a and an organic light-emitting element 200b. Hereinafter, detailed descriptions of the display unit 200 will be given below with reference to FIG. 3.

A buffer layer 212 may be formed on the first substrate 100. The buffer layer 212 prevents permeation of impurity ions via the first substrate 100 and provides a flat surface on the first substrate 100, where the buffer layer 212 may be formed of any of various materials suitable for the functions. For example, the buffer layer 212 may contain an inorganic material, such as silicon oxide, silicon nitride, silicon oxynitride, aluminum oxide, aluminum nitride, titanium oxide, or titanium nitride; or an organic material, such as polyimide, polyester, or acryl, where the buffer layer 212 may be formed as a stacked structure including a plurality of the above-stated materials.

An active layer 221 may be formed on the buffer layer 212 using an inorganic semiconductor, e.g., silicon, or an organic semiconductor. The active material 221 includes a source region, a drain region, and a channel region disposed therebetween. For example, if the active material 221 is formed using amorphous silicon, the active material 221 including a source region, a drain region, and a channel region therebetween may be formed by forming an amorphous silicon layer on the first substrate 100, forming a poly-crystal silicon layer by crystallizing the amorphous silicon layer, patterning the poly-crystal silicon layer, and doping impurities to a source region and a drain region at edges of the poly-crystal silicon layer.

A gate insulation layer 213 is formed on the active material 221. The gate insulation layer 213 insulates the active material 221 from the gate electrode 222, and may be formed of an inorganic material, such as $SiN_x$ or $SiO_2$.

The gate electrode 222 is formed at a designated region on the gate insulation layer 213. The gate electrode 222 is connected to a gate line (not shown) for applying ON/OFF signal to a TFT.

The gate electrode 222 may contain Au, Ag, Cu, Ni, Pt, Pd, Al, or Mo, and may contain an alloy, such as Al:Nd or Mo:W. However, the gate electrode 222 may also be formed of various other materials based on design considerations.

An interlayer insulation layer 214 formed on the gate electrode 222 is a layer for insulating the gate electrode 222, a source electrode 223, and a drain electrode 224 from one another, and may be formed of an inorganic material, such as $SiN_x$ or $SiO_2$.

The source electrode 223 and the drain electrode 224 are formed on the interlayer insulation layer 214. In detail, the interlayer insulation layer 214 and the gate insulation layer 213 are formed to expose the source region and the drain region of the active material 221, and the source electrode 223 and the drain electrode 224 are formed to contact the source region and the drain region of the active material 221, respectively.

Meanwhile, although FIG. 3 shows a top gate type TFT including the active material 221, the gate electrode 222, the source electrode 223, and the drain electrode 224 in the order stated, the gate electrode 222 may alternatively be disposed below the active material 221.

The TFT 200a is electrically connected to the organic light-emitting element 200b, drives the organic light-emitting element 200b, and is covered and protected by a planarizing layer 215.

The planarizing layer 215 may be an inorganic insulation layer and/or an organic insulation layer. The inorganic insulation layer may include $SiO_2$, $SiN_x$, SiON, $Al_2O_3$, $TiO_2$, $Ta_2O_5$, $HfO_2$, $ZrO_2$, BST, or PZT, whereas the organic insulation layer may include a general commercial polymer (PMMA or PS), a polymer derivative containing the phenol-based group, acryl-based polymer, imide-based polymer, arylether-based polymer, amide-based polymer, fluorine-based polymer, p-xylene-based polymer, vinyl alcohol-based polymer, or a blend thereof. Furthermore, the planarizing layer 215 may be formed as a composite stack of an inorganic insulation layer and an organic insulation layer.

The organic light-emitting element 200b may include a pixel electrode 231, an intermediate layer 232, and a counter electrode 233.

The pixel electrode 231 is formed on the planarizing layer 215 and is electrically connected to the drain electrode 224 via a contact hole 230 formed in the planarizing layer 215.

The pixel electrode 231 may be a reflective electrode and may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may contain at least one selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

The counter electrode 233 faces the pixel electrode 231 and may be a transparent or semi-transparent electrode formed of a metal thin-film containing a metal with a small work function, such as Li, Ca, LiF/Ca, LiF/Al, Al, Ag, Mg, or a compound thereof. Furthermore, an auxiliary electrode layer or a bus electrode may be further formed on the metal thin-film using a material for forming a transparent electrode, such as ITO, IZO, ZnO, or $In_2O_3$.

Therefore, the source electrode 223 may transmit light emitted by an organic emission layer (not shown) included in the intermediate layer 232. In other words, light emitted by the organic emission layer may be reflected directly, or by the pixel electrode 231 formed as a reflective electrode, and may be emitted toward the counter electrode 233.

However, exemplary embodiments of the organic light emitting display device 10 are not limited to the top emission type display device, and may alternatively be configured as a bottom emission type display device, in which a light emitted by an organic emission layer (not shown) is emitted toward the first substrate 100. In this case, the pixel electrode 231 may be formed as a transparent or semi-transparent electrode, whereas the counter electrode 233 may be formed as a reflective electrode. Furthermore, the organic light emitting display device 10 according to the present exemplary embodiment may be a two-way emission type display device that emits lights in two opposite top and bottom directions.

Meanwhile, a pixel defining layer 216 is formed on the pixel electrode 231 using an insulation material. The pixel defining layer 216 may be formed of one or more organic insulation materials selected from a group consisting of polyimide, polyamide, acrylic resin, benzocyclobutene, and phenolic resin using a method like spin coating. The pixel defining layer 216 exposes a designated region of the pixel electrode 231, and the intermediate layer 232, including an organic emission layer, is located at the exposed region.

The organic emission layer (not shown) included in the intermediate layer 232 may be formed of an organic monomer material or an organic polymer material, where the intermediate layer 232 may further include function layers other than the organic emission layer, such as a hole transport layer (HTL), a hole injection layer (HIL), an electron transport layer (ETL), and an electron injection layer (EIL), selectively.

Meanwhile, the non-display unit 210 may be defined on the first substrate 100 as a region excluding the display unit 200. Here, the non-display unit 210 may be formed to have a frame-like shape along outer edges of the display unit 200 to surround the display unit 200.

Furthermore, the non-display unit 210 may include a plurality of wirings 501 that are connected to the display unit 200 and extend toward an edge of the first substrate 100. Furthermore, the first sealing unit 300 may be disposed along edges of the first substrate 100 and the second substrate 110 at the outermost portions of the non-display unit 210, and the second sealing unit 400 may be disposed on the non-display unit 210 at a gap 500 between the first sealing unit 300 and the display unit 200.

The first sealing unit 300 seals edges of the space between the first substrate 100 and the second substrate 110. As described above, although the second substrate 110 blocks most of moisture or oxygen in the air, if there is a space between the second substrate 110 and the first substrate 100, moisture or oxygen may permeate through the space. Therefore, the gap 500 between the second substrate 110 and the first substrate 100 is sealed by using the first sealing unit 300. Therefore, the first sealing unit 300 may form a closed curve that perfectly seals edges of the first substrate 100 or the second substrate 110.

Furthermore, according to an exemplary embodiment, the first sealing unit 300 may be formed of a glass material capable of blocking moisture or air. For example, the first sealing unit 300 may contain frit. Here, the frit may be formed of one or more materials selected from a group consisting of $K_2O$, $Fe_2O_3$, $Sb_2O_3$, $ZnO$, $P_2O_5$, $V_2O_5$, $TiO_2$, $Al_2O_3$, $B_2O_3$, $WO_3$, $SnO$, and $Pb$. Furthermore, the frit may be doped with a filler that lowers the thermal expansion coefficient of the frit, such that thermal expansion coefficient of the frit substantially matches that of the first substrate 100 or the second substrate 110. Here, the filler may be an inversion filler or an additive filler.

The first sealing unit 300 is melted by radiating a laser beam or an infrared ray and re-hardened for complete adherence between the first substrate 100 and the second substrate 110. Therefore, the organic light-emitting element may be completely sealed and protected from oxygen and moisture.

As described above, because the first sealing unit 300 is formed of a glass material, the first sealing unit 300 is heated at a high temperature for melting the same. Thus, while the first sealing unit 300 is being hardened, the organic light-emitting element 200b disposed at the display unit 200 may be damaged. To prevent such damage to the organic light-emitting element 200b, the first sealing unit 300 is disposed apart from the display unit 200.

As described above, the frit is a glass material with fragility. Therefore, an auxiliary sealing unit may be formed inside the first sealing unit 300 containing the frit. Therefore, according to an exemplary embodiment, the second sealing unit 400, which functions as an auxiliary sealing unit, is disposed between the first substrate 100 and the second substrate 110.

The second sealing unit 400 may be formed between the first substrate 100 and the second substrate 110 along the inner edges of the first sealing unit 300. Here, the main sealing unit and the auxiliary sealing unit may be disposed apart from each other, thereby preventing shock waves applied to the auxiliary sealing unit from being transmitted to the main sealing unit.

The second sealing unit 400, which blocks shock waves transmitted toward the first sealing unit 300 containing the frit, may be formed of a resin. In other words, to function as a buffer for sufficient absorption of external shocks, the second sealing unit 400 may contain a material selected from among a poly-silicon-based material, an epoxy-based material, and various other organic materials. Furthermore, by employing a flexible organic material as described above, fragility of the frit of the first sealing unit 300 may be reduced. Particularly, excellent adherence of an epoxy-based resin may prevent the both substrates from being detached from each other, and may provide high reliability with respect to peeling test.

Meanwhile, the second sealing unit 400 may include a plurality of dots disposed to be apart from one another. When the second sealing unit 400 includes the plurality of dots, the volume of a material for forming the entire sealing line may be reduced. Therefore, as compared to a case in which a successive sealing line is formed, an amount of residual gas discharged from a sealing material may be further reduced.

If an amount of residual gas discharged from a sealing material is reduced as described above, permeations of moisture and oxygen into the display unit 200 may be prevented, and adherence at the sealing line may be improved.

The width of the second sealing unit 400 may be to the same as, or up to twice as large as, the width of the first sealing unit 300. Since mechanical strength of the overall sealing structure is improved, the width of the first sealing unit 300 may be reduced, and thus dead space may be reduced.

Hereinafter, various exemplary embodiments of shapes and arrangements of dots constituting the second sealing unit 400 will be described.

FIGS. 1 and 2A show dots having circular shapes, and a plurality of dots are uniformly disposed.

Figure 4:
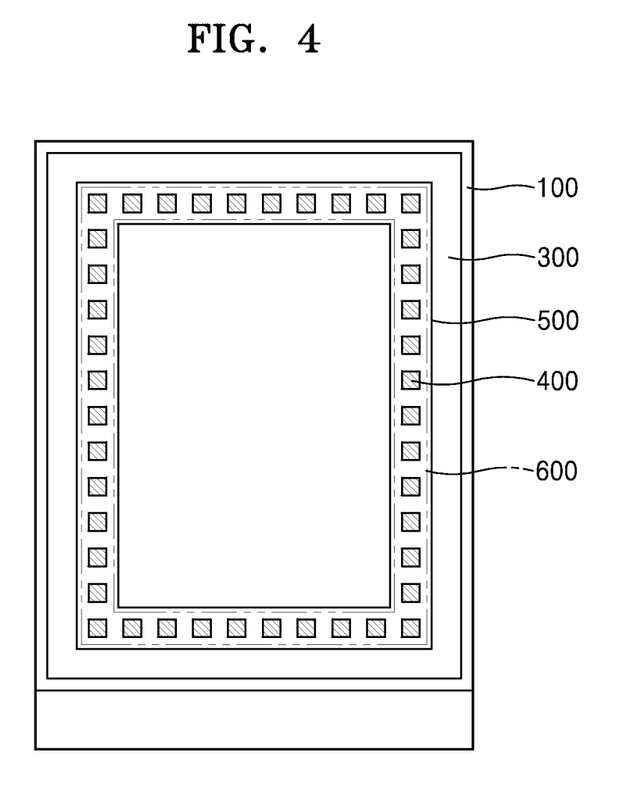
FIGS. 4 and 5 are schematic plan views showing other embodiments with dots having different shapes and arrangements from those in the organic light emitting display device of FIG. 1.
Figure 5:
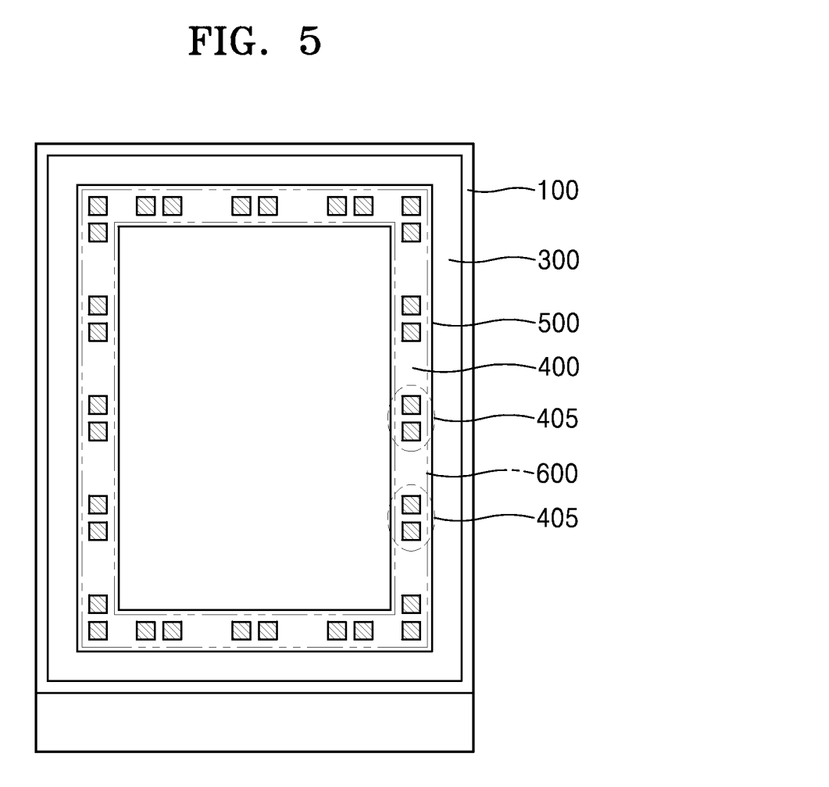

Meanwhile, FIGS. 4 and 5 are schematic plan views showing other exemplary embodiments with dots having different shapes and arrangements from those in the organic light emitting display device of FIG. 1.

However, the shapes of the dots are not limited thereto. The dots may have a rectangular shape, as shown in FIG. 4, or may have any of various shapes, e.g., a rhombus-like shape, a donut-like shape, etc. Furthermore, dots having such a shape may be disposed to be tilted with respect to edges of the substrate.

As shown in FIG. 5, at least two dots may form a single set 405, and a plurality of sets 405 may be disposed to be apart from one another. By arranging a plurality of plurality of dots in the form of the sets 405 as described above, a larger number of discontinuous portions are formed, and thus, residual gas may be discharged more effectively. Furthermore, adherence of the second sealing unit 400 may be further improved.

The dots may be formed via printing, nozzle jetting, or any other suitable method.

Meanwhile, in order to not to expose the second sealing unit 400 to the outside, the screen 600 may be formed on a surface opposite to a surface of the second substrate 110 facing the first substrate 100.

In case of the second sealing unit 400 formed inside the first sealing unit 300, since the second substrate 110, which is the top substrate, is formed of a transparent material, a user may be mistakenly identify the second sealing unit 400 as a foreign substance when the user is looking at the display device. Therefore, the second sealing unit 400 disposed close to a display unit may be considered to be a cosmetic defect. Therefore, to prevent the second sealing unit 400 from being seen from outside, the screen 600 is formed on the top surface of the second substrate 110.

The screen 600 may include a single metal film or stacked films including a metal film and an inorganic film. In other words, the screen 600 may be a film containing a metal or an opaque film, such as a film included in a touch screen panel.

Selectively, the screen 600 may further include a scattering film for scattering a light incident from outside. The scattering film may include an inorganic film and the light transmittance of the inorganic film may be 60% or lower.

Furthermore, the screen 600 may be formed to have a width greater than or at least equal to that of the second sealing unit 400 to efficiently cover the second sealing unit 400.

However, the screen 600 may not only cover the second sealing unit 400, but also narrow viewing angle of a display device. Therefore, the screen 600 may be formed to not to overlap the display unit 200.

Figure 6:
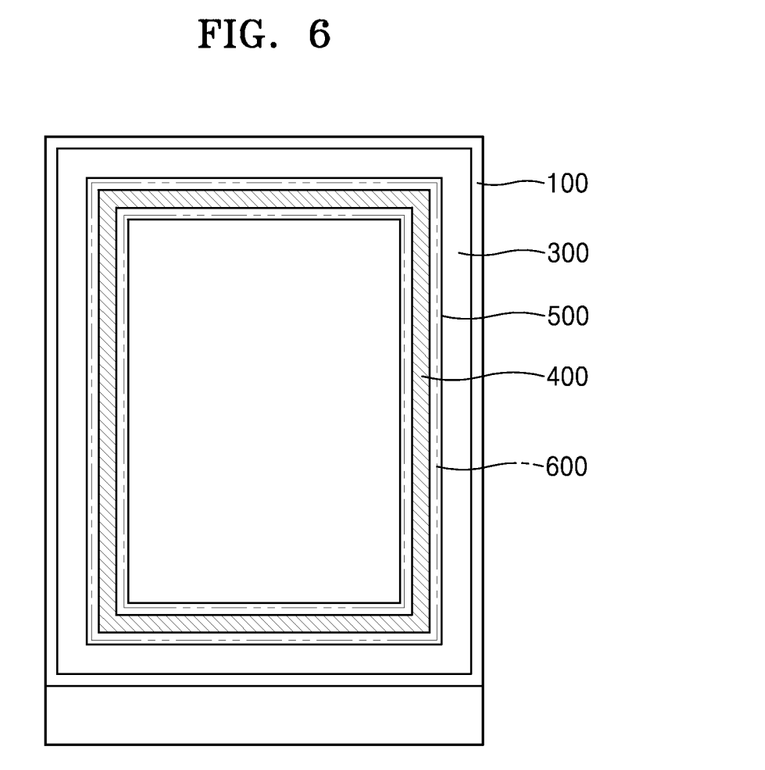
FIG. 6 is a schematic plan view of an organic light emitting display device having a second sealing unit having a different shape from that of the organic light emitting display device of FIG. 1.

Meanwhile, according to another exemplary embodiment, the second sealing unit 400 may be disposed between the first substrate 100 and the second substrate 110 along the inner edges of the first sealing unit 300 in the form of a single strip, as in the first sealing unit 300.

FIG. 6 is a schematic plan view of an organic light emitting display device having a second sealing unit having a different shape from that of the organic light emitting display device of FIG. 1.

As shown in FIG. 6, this exemplary embodiment is identical to the organic light emitting display device of FIG. 1, except the organic light emitting display device of FIG. 1 includes a plurality of dots.

As described above, organic light emitting display devices according to exemplary embodiments have double sealing structures, thereby resolving mechanical strength problem of a single sealing structure and preventing an auxiliary sealing unit inside a double sealing structure to be seen by a user as a defect.

As described above, organic light emitting display devices according to the one or more of the above exemplary embodiments may improve mechanical strength of a sealing unit formed of a frit and reduce dead space.

Furthermore, organic light emitting display devices according to the above exemplary embodiments have an improved cosmetic appearance to prevent cosmetic defects.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting display device comprising:
   a first substrate;
   a second substrate facing the first substrate;
   a display unit disposed on a surface of the first substrate facing the second substrate, the display unit comprising at least one organic light-emitting element;
   a first sealing unit disposed between the first substrate and the second substrate and surrounding the display unit;
   a second sealing unit disposed between the first substrate and the second substrate along the inner edges of the first sealing unit, the second sealing unit comprising a plurality of discrete areas disposed apart from one another; and
   a screen disposed on a surface of the second substrate opposite a surface facing the first substrate, the screen configured to cover the second sealing unit,
   wherein:
   the screen comprises:
      an opening overlapping a central portion of the display unit; and
      stacked films comprising a metal film and an inorganic film and overlapping the second sealing unit; and
   transmittance of the inorganic film is 60% or lower.

2. The organic light emitting display device of claim 1, further comprising a non-display unit disposed on the first substrate along outer edges of the display unit, the non-display unit comprising a plurality of wirings extending toward an edge of the first substrate.

3. The organic light emitting display device of claim 2, wherein the second sealing unit is disposed on the non-display unit to at least overlap the plurality of wirings.

4. The organic light emitting display device of claim 1, wherein the width of the second sealing unit is equal to or up to twice as large as the width of the first sealing unit.

5. The organic light emitting display device of claim 1, wherein each of the discrete areas has a circular shape or a polygonal shape.

6. The organic light emitting display device of claim 4, wherein:
   at least two of the discrete areas form one of a plurality of sets; and
   the sets are disposed to be apart from one another.

7. The organic light emitting display device of claim 1, wherein the second sealing unit comprises a poly-silicon material, an epoxy material, or at least one other organic material.

8. The organic light emitting display device of claim 1, wherein the first sealing unit comprises a frit.

9. The organic light emitting display device of claim 1, wherein the width of the screen is greater than or at least equal to the width of the second sealing unit.

10. An organic light emitting display device comprising:
    a first substrate;
    a second substrate facing the first substrate;
    a display unit disposed on a surface of the first substrate facing the second substrate, the display unit comprising at least one organic light-emitting element;
    a first sealing unit disposed between the first substrate and the second substrate and surrounding the display unit;
    a second sealing unit disposed between the first substrate and the second substrate along the inner edges of the first sealing unit; and a screen disposed on a surface of the second substrate opposite a surface facing the first substrate, the screen configured to cover the second sealing unit, wherein:

the screen comprises:
  an opening overlapping a central portion of the display unit; and
  stacked films comprising a metal film and an inorganic film and overlapping the second sealing unit; and
  transmittance of the inorganic film is 60% or lower.

11. The organic light emitting display device of claim 10, further comprising a non-display unit disposed on the first substrate along the outer edges of the display unit, the non-display unit comprising a plurality of wirings extending toward an edge of the first substrate.

12. The organic light emitting display device of claim 11, wherein the second sealing unit is disposed on the non-display unit to at least overlap the wirings.

13. The organic light emitting display device of claim 10, wherein the width of the second sealing unit is equal to or up to twice as large as the width of the first sealing unit.

14. The organic light emitting display device of claim 10, wherein the second sealing unit comprises one selected from among a poly-silicon material, an epoxy material, and at least one other organic material.

15. The organic light emitting display device of claim 10, wherein the first sealing unit comprises a frit.

16. The organic light emitting display device of claim 10, wherein the width of the screen is greater than or at least equal to the width of the second sealing unit.

* * * * *